United States Patent [19]

Crochiere et al.

[11] 4,020,332

[45] Apr. 26, 1977

[54] INTERPOLATION-DECIMATION CIRCUIT FOR INCREASING OR DECREASING DIGITAL SAMPLING FREQUENCY

[75] Inventors: Ronald Eldon Crochiere, Chatham; Lawrence Richard Rabiner, Berkeley Heights, both of N.J.

[73] Assignee: Bell Telephone Laboratories, Incorporated, Murray Hill, N.J.

[22] Filed: Sept. 24, 1975

[21] Appl. No.: 616,283

[52] U.S. Cl. .............................................. 235/152
[51] Int. Cl.[2] ........................................ G067 15/34
[58] Field of Search ........................... 235/152, 156

[56] References Cited

UNITED STATES PATENTS

| | | | |
|---|---|---|---|
| 3,829,670 | 8/1974 | Kebabian | 235/152 |
| 3,872,290 | 3/1975 | Crooke et al. | 235/152 |

OTHER PUBLICATIONS

Schafer et al., "A Digital Signal Processing Approach to Interpolation", *Proceedings of the IEEE*, June 1973, pp. 692–702.

Bellanger et al., "Interpolation, Extrapolation & Reduction of Computation Speed in Digital Filters", *IEEE Trans. on Acoustics, Speech and Signal Processing*, Aug. 1974, pp. 231–235.

*Primary Examiner*—David H. Malzahn
*Attorney, Agent, or Firm*—A. E. Hirsch, Jr.; Robert O. Nimtz; J. S. Cubert

[57] ABSTRACT

A general purpose interpolator-decimator circuit for increasing or decreasing the sampling rate of a digital signal by a factor L/M, where L and M are integers, is disclosed. The circuit includes means for determining each output sample by multiplying a sequence of previous input samples by a set of coefficients and accumulating the resulting products. L sets of coefficients, in which each coefficient is a function of the factors L and M, are stored in a specific sequence which permits sequential addressing of both the coefficients and input signal samples. A multistage decimator cascaded with a multistage interpolator to effect a narrow-band FIR filter is also disclosed.

9 Claims, 4 Drawing Figures

INTERPOLATION-DECIMATION CIRCUIT FOR INCREASING OR DECREASING DIGITAL SAMPLING FREQUENCY

BACKGROUND OF THE INVENTION

This invention relates to apparatus for implementing digital interpolators and decimators which are respectively circuits for increasing and decreasing a digital sampling rate.

This invention is closely related to the copending application for patent, Crochiere-Rabiner-Shively Ser. No,. 610,540, filed Sept. 5, 1975.

With the increasing number of uses of digital technology in signal processing, the need for efficiently translating between various sampling rates has become apparent. Apparatus for increasing or decreasing a digital system sampling rate is required, for example, in the conversion of a digital signal code format, e.g., conversion from delta modulation at one sampling rate to pulse code modulation at a second sampling rate. Another use is the transmission of speech in an analysis-synthesis system, such as a vocoder, wherein sampling rate reduction is required for efficient transmission and sampling rate increase is required for regeneration of the speech at the receiving terminal.

Yet another use, disclosed by Bellanger, Daguet and Lepagnol in "Interpolation, Extrapolation and Reduction of Computational Speed in Digital Filters," *IEEE Transactions on Acoustics, Speech and Signal Processing*, Vol. ASSP-22, No. 4, pages 231-235, August 1974, is the efficient realization of finite impulse response (FIR) digital filters by multistage decimators and interpolators. In the Bellanger et al filter, the sampling rate is first reduced, the signal is filtered, and then the sampling rate is increased to that of the original signal. The sampling rate decrease was realized by Bellanger et al with multistage decimation circuits which were half-band filters, with each filter reducing the sampling rate by a factor of two. In accordance with the Bellanger et al disclosure, the frequency was increased to the original sampling frequency by a reverse process which again employed interpolation by a factor of two at each stage.

Schafer and Rabiner, in "A Digital Signal Processing Approach to Interpolation," *Proceedings of the IEEE*, Vol. 61, No. 6, pages 692-702, June, 1973, have shown that decimation and interpolation can be efficiently implemented using FIR filters. Further, in this article, Schafer and Rabiner demonstrate that the sampling rate conversion between any rational ratio of sampling frequencies can be efficiently implemented by a two-stage process consisting of an integer sampling rate increase, followed by an integer sampling rate decrease.

Although the prior art has demonstrated that single stage or multistage interpolation and decimation result in computational efficiency, the prior art has not provided an interpolation or decimation circuit which can be realized by relatively simple circuit structure. In fact, implementations proposed by the prior art, e.g., the FIR filter of Bellanger et al, are structurally complex since such systems involve signals at several different sampling rates and also require circuit means which effectively keep track of when particular multiplications must be performed. Moreover, the prior art circuits have generally been designed for a specific application and have not been suited for widespread usage.

Accordingly, it is an object of this invention to realize decimation and interpolation circuits which can be used in a wide variety of digital processing applications.

Further, it is an object of this invention to realize decimation and interpolation circuits which do not require either complex circuitry operating at several sampling frequencies or complex logic circuitry to implement the required signal multiplications.

SUMMARY OF THE INVENTION

These and other objects are achieved in accordance with this invention by a circuit similar in structure to the direct form realization of a finite impulse response (FIR) filter circuit. In accordance with this invention, the filter coefficients are functions of the desired decimation and interpolation factors. More specifically, the interpolation-decimation circuit of this invention employs L sets of filter coefficients, where L is the desired interpolation factor, with a particular set of coefficients being employed to determine the value of each point of the output signal. Each set of coefficients is stored in a memory unit, with coefficients within each set arranged in a specific predetermined order to allow sequential addressing of both the input signal data and the stored coefficients. Embodiments as a single-stage interpolator-decimator and as multiple stage decimators and interpolators to implement a narrow-band FIR filter are included.

DETAILED DESCRIPTION

Figure 1:
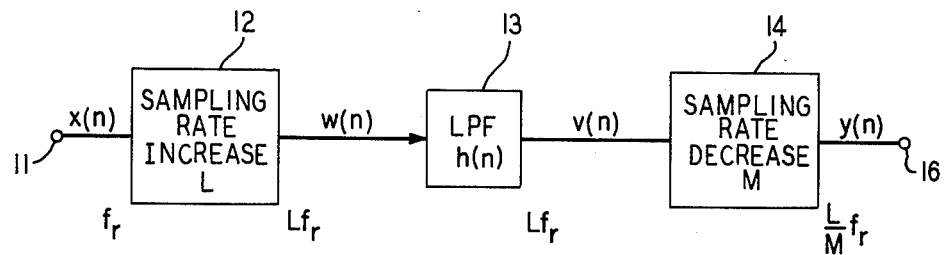
FIG. 1 depicts, in block diagram form, a general purpose interpolator-decimator circuit which is helpful in understanding this invention.

FIG. 1 depicts a circuit for changing the sampling rate of an applied signal by the factor L/M. It will be recognized by those skilled in the art that this structure is effectively an interpolator circuit cascaded with a decimator circuit in which the interpolator low-pass filter and decimator low-pass filter have been combined in single low-pass filter 13. Since the circuit of FIG. 1 first increases the sampling frequency by an integer factor L and subsequently decreases the sampling frequency by an integer factor M, it can be observed that the sampling rate conversion of the circuit is L/M. Thus, the circuit of FIG. 1 is a general interpolation-decimation circuit in which the interpolation or decimation factor is determined by L and M. Accordingly, if $L=1$, the circuit becomes an integer decimator, and if $M=1$, the circuit becomes a typical integer interpolator.

In the operation of the circuit of FIG. 1, a digital input signal having a sampling frequency $f_r$ is applied to input terminal 11. Sampling rate increase unit 12 increases the sampling frequency to $Lf_r$ by inserting $L-1$ zero-valued samples between the samples of input signal $x(n)$. This signal, denoted $w(n)$ in FIG. 1, is low-pass filtered by filter 13 to produce the signal denoted as $v(n)$. Low-pass filter 13 is preferably an FIR filter realized by a standard direct form implementation, since savings in computation can thereby be realized. When filter 13 is an FIR filter, the signal $v(n)$ is related to the signal $w(n)$ by $$v(n) = \sum_{m=0}^{N-1} h(m) w(n-m) \quad (1)$$

where $h(m)$, $m=0, 1 \ldots, N-1$ are the filter coefficients and N is the duration of the unit sample response of filter 13.

Sampling rate decrease circuit 14 decreases the sampling rate by effectively selecting every $M$th sample of the interpolated signal $v(n)$. Accordingly, the signal coupled to output terminal 16 exhibits the sampling frequency $(L/M)f_r$, where L and M may be selected to provide decimation or interpolation by any rational number.

From Equation (1), it can be seen that the computation of an output point depends solely on past and present values of $w(n)$ and not upon past values of any internal filter variables. Thus, the filter computations need only be performed for every Mth output signal. Furthermore, since $w(n)$ is non-zero only for every Lth input point, only a single multiplication and addition need be performed for every Lth input point. Thus, in the interpolator-decimator of FIG. 1, the effective number of multiplications and additions perfomed by the circuit is N/(LM) per output sample instead of N, as would be predicted by a cursory examination of Equation (1).

Although the interpolation-decimation circuit of FIG. 1 could be realized by utilizing state-of-the art interpolator-decimator and filter circuits, such an implementation is generally very complicated, since it involves signals at several different sampling rates and also involves keeping track of the particular multiplication which must be performed.

Utilizng the concepts of the circuit of FIG. 1, we have discovered that a general interpolator-decimator circuit can be realized by relatively simple circuit structure which is similar to the direct form implementation of an FIR filter. If the unit sample response duration of low-pass filter 13 is N samples, L-1 out of every L samples of $w(n)$ are zero-valued and thus the computation is proportional to N/L, since the unit sample response spans approximately N/L non-zero samples. If N is chosen to be $N=QL$ where $Q$ is a predetermined integer, then the unit sample response will span exactly Q non-zero samples of $w(n)$ for each filter cycle. It can be seen that this condition can be easily satisfied since $h(n)$ can be appended with a small number of zero-valued coefficients until N is equal to QL. Defining N in this manner, we have determined that each output point $y(n)$ is of the form $$y(n) = \sum_{k=0}^{Q-1} h(kL + (nM) + L) x \left( \left[ \frac{nM}{L} \right] - k \right) \quad (2)$$

where $(nM) + L$ denotes $nM$ modulo L, $[(nM/L)]$ denotes $(nM/L)$ rounded up to the next largest interger, and the sequence $h(n)$, $n=0, 1 \ldots, N-1$ contains the coefficients of the direct form FIR filter, (or, equivalently, the samples of its impulse response).

It can be noted in Equation (2) that to compute each output point $y(n)$, $x(n)$ is sequentially addressed for Q of its values and that $[(n+1)M/L] - [nM/L]$ new input samples are required for the calculation of the next output point, $y(n+1)$. Examining the expression for $h(n)$ in Equation (2), it can be further noted that during the calculation of any output sample $y(n)$, $h(n)$ must be addressed to arguments, where $K=0, 1, \ldots Q-1$ Thus, $h(n)$ can be addressed sequentially only if the coefficients of $h(n)$ are stored in an appropriate scrambled order. That is, to determine $Y(0)$ the sequence or set $g_0(n)$ of Q coefficents $g_0(n) = h(0), h(L) \ldots, h((Q-1)L)$ is required. To determine $y(1)$, the sequence or set $g_1(n)$, of Q coefficient $g_1(n) = h(M+L), h(L+M+L) \ldots h((Q-1)L+M+L)$ is required, whereas to compute $y(L-1)$ the sequence $g_{L-1}(n)$, of Q coefficients $g_{L-1}(n) = h(((L-1)M) + L), h(L+((L-1)M) + L) \ldots, h((Q-1)L + ((L-1)M) + L)$ is needed. Finally, to compute $y(L)$, the sequence $g_0(n)$ is again required and the cycle repeats.

Figure 2:
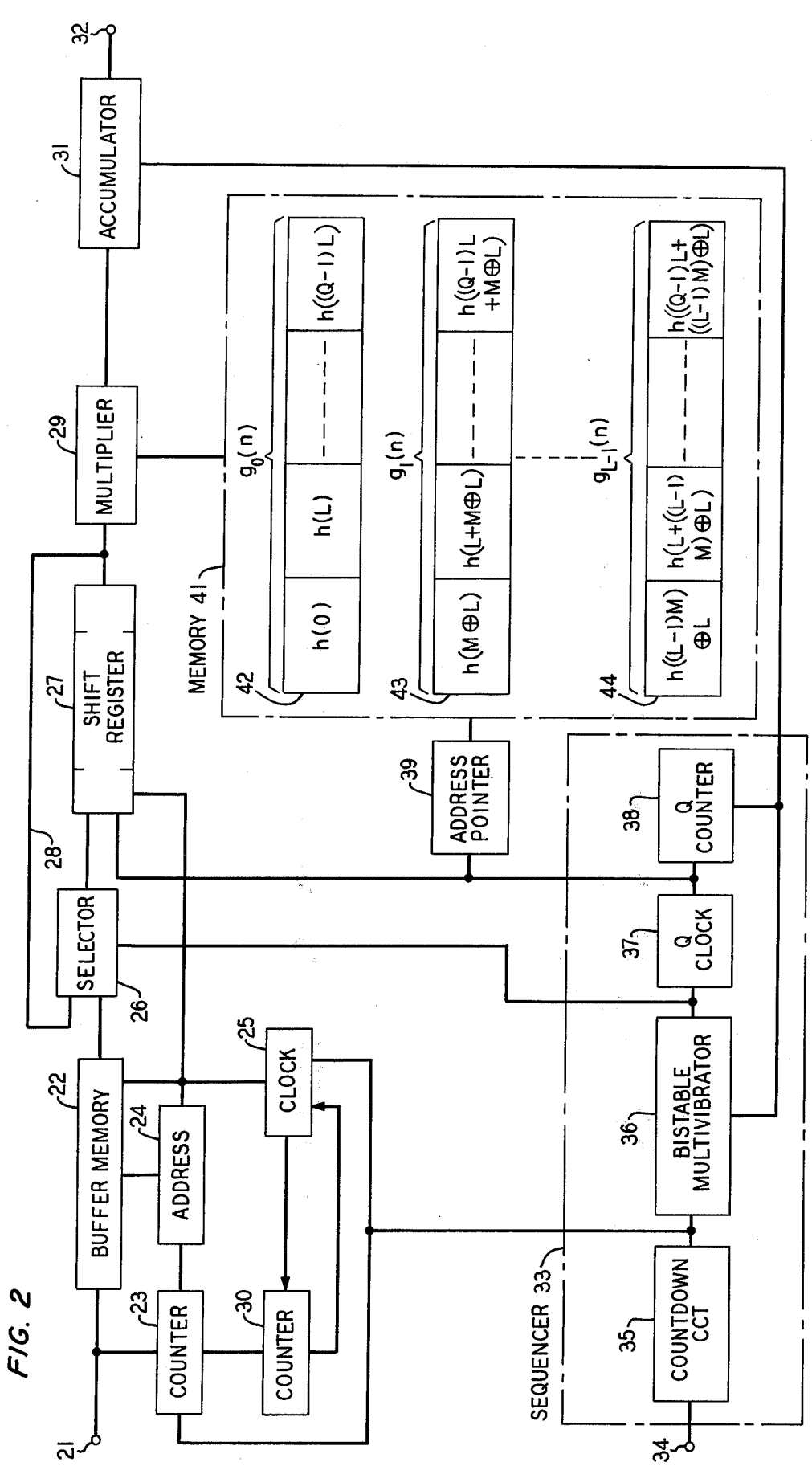
FIG. 2 illustrates an embodiment of a single-stage interpolator-decimator circuit in accordance with this invention.

FIG. 2 depicts an embodiment of our invention employing the above principles to realize a general purpose interpolator-decimator. In FIG. 2, Q samples of the input signal are stored in shift register 27 and the $h(n)$ coefficients are stored in memory 41 (e.g., a conventional read-only (ROM) memory) in the scrambled order described above.

A particular output sample $y(n)$ is calculated by sequentially shifting an input sample from shift register 27 and the corresponding coefficient from memory 41 to the input terminals of multiplier 29. The product of the input sample and the coefficient is coupled to accumulator 31, which may be a conventional accumulator circuit which normally includes an adder and a register wherein the quantity contained in the register is added to the incoming signal and the resulting sum is stored in the register. Multiplier 29 can be any conventional multiplier circuit capable of handling the digital format employed in any particular embodiment.

The operation of the circuit of FIG. 2 can be best understood by assuming that a particular output sample $y(n-1)$ has just been determined and the circuit is starting the sequence to determine the output sample $y(n)$. At the beginning of such a sequence, signal samples which arrived during the calculation of $y(n-1)$ are contained in buffer memory 22, which may be any conventional memory circuit of suitable capacity. As each of the signals stored in memory 22 arrived at input terminal 21, counter 23 was incremented one count and address circuit 24 directed each input sample into a separate addressable location within buffer memory 22. Thus, at the beginning of any given sequence, counter 23 contains the number of input samples which are contained in buffer memory 22 and must be loaded into shift register 27 for the new calculation sequence. In addition, at the end of the previous sequence, Q-counter 38 of sequencer 33 reached the count Q, activating selector circuit 26 to connect the input of shift register 27 to buffer memory 22.

The calculation sequence is initiated by countdown circuit 35 which effectively counts down from the system master clock frequency, $Lf_r$, (applied to terminal 34) to supply a signal of frequency $(L/M) f_r$, i.e., Countdown circuit 35 counts down M samples from the master clock. It will be understood by those skilled in the art that a variety of such countdown circuits are available, e.g., logic gates may be connected directly to the system master clock to generate a single pulse each time the master clock reaches a predetermined count. The output pulse of countdown circuit 35 initiates the calculation sequence by transferring the data stored in buffer memory 22 into shift register 27. This transfer is effected by Clock 25 and counter 30 which operate in conjunction with counter 23 and address circuit 24. The output pulse of countdown circuit 35 starts clock 25 which operates at a frequency high enough to generate at least as many clock pulses as the maximum number of input samples which must be loaded into shift register 27 before Q-clock 37 begins to operate. Each clock pulse of clock 25 increments address circuit 24 and strobes buffer memory 22 to transfer the data samples in buffer memory 22 to shift register 27. These data samples are transferred to the shift register in the order in which they arrived at input terminal 21. The clock pulses generated by clock 25 are counted by counter 30. When the count reaches the count stored in counter 23, the last updating sample is transferred to shift register 27 and counter 30 stops clock 25 and resets counter 23 back to zero. Additionally, the output pulse of countdown circuit 35 switches the state of bistable multivibrator 36 which, in turn, starts Q-clock 37 running. Q-clock 37 is a conventional clock circuit which has a frequency high enough to generate Q pulses during the period $M/(Lf_r)$. Multivibrator 36 is a conventional multivibrator which operates with a sufficient delay to allow completion of the above-described loading sequence.

The clock pulses from Q-clock 37 are coupled to shift register 27 and address pointer 39. As will become apparent from the following discussion, address pointer 39 was automatically indexed to the storage location of the proper coefficient block at the conclusion of the previous calculation sequence. For example, if the previous calculation sequence determined output sample $y(0)$, address pointer 39 would be initially indexed to the last coefficient stored in block 43 of memory unit 41 to begin the calculation of output sample $y(1)$. In this case, shift register 27 would contain the input samples $$x([M/L]), x([M/L]-1), \ldots, x([M/L] - (Q-1)).$$

It can be noted that regardless of which output sample was being calculated, shift register 27 would contain the proper input samples in an ordered sequence due to the previously discussed operation of memory 22, counters 23 and 30, address circuit 24, and clock 25.

During the calculation of each output sample $y(n)$, clock pulses from Q-clock 37 sequentially shift input sample $x([nM/L] - k)$ and coefficient $h(kL + (nM) + L)$ to multiplier 29. Thus, for example, in the calculation of output sample $y(1)$, the first clock pulse from Q-clock 37 shifts $x([M/L]-(Q-1))$ to one input terminal of multiplier 29, while the coefficient $h((Q-1)L + M + L)$ is coupled to the second input terminal of multiplier 29. Since selector 26 was activated by multivibrator 36 at the same time Q-clock 37 was energized, each input sample is recirculated to the input terminal of shift register 27 as it is shifted to the input of multiplier 29. With each clock pulse from Q-clock 37, the next input sample is shifted to one input terminal of multiplier 29 and address pointer 39 is advanced to the next storage location within memory 41 to provide the proper coefficient to the second input terminal of multiplier 29.

Q-counter 38, which is a conventional counting circuit, counts the number of clock pulses generated by Q-clock 37. When Q-clock pulses have been generated, the calculation of the output sample will be complete and the value of the output sample will be stored in accumulator 31. Upon reaching the count of Q, Q-counter 38 causes bistable multivibrator 36 to be reset, shutting off Q-clock 37, while simultaneously activating selector 26 to connect the input terminal of shift register 27 to the output terminal of buffer memory 22. For example, in the calculation of the output sample $y(1)$, after the $(Q-1)$th clock pulse address pointer 39 will be indexed to the coefficient $h(M + L)$ in coefficient block 43 of memory 41 and the input sample $x([M/L])$ will be in the final register of shift register 27. The Qth clock pulse will then couple this input signal and coefficient to multiplier 29 and the product will be added to the sum of the previous products by accumulator 31. At this point, calculation of a single output sample is complete and the value of the sample is stored in accumulator 31. It should be noted that the Qth clock pulse of clock 37 sets address pointer 39 to the last coefficient of the next output sequence $g_2(n)$ and recirculates the last input sample of the interval calculated within shaft register 27. For example, in the previously referred to case of the determination of $y(1)$, address pointer 39 would be indexed to the last coefficient in the $g_2(n)$ block of coefficients within memory 41, i.e., $h((Q-1)L + (2M) + L)$ and shift register 27 would hold input samples $x([M/L])$, $x([M/L] - 1), \ldots, x([M/L] - (Q-1))$.

During this calculation sequence, counter 23 and address unit 24 have been in operation to count a number of arriving input samples and store each arriving sample in buffer memory 22. It should be noted that the frequency of Q-clock 37 is high enough to ensure that each calculation is complete prior to an output pulse from countdown circuit 35, that is, the Q calculations necessary to determine a particular output sample are completed in a period of time less than $M/Chf_r$). Thus, depending on the frequency of Q-clock 37, the input samples necessary to compute the next output sample may or may not have arrived at input terminal 21 when the calculation of a particular output sample is complete. In any case, the samples will arrive prior to an output pulse from countdown circuit 35. When countdown circuit 35 reaches the count M it stops counter 23 and address circuit 24 which, as previously described, in conjunction with clock 25 and counter 30, sequentially shift the input samples stored in buffer memory 22 into shift register 27. Simultaneously, countdown circuit 35 sets bistable multivibrator 36 which starts Q-clock 37, thus beginning the calculation of the next output sample.

It can be noted that the number of samples to be transferred from buffer memory 22 to shift register 27 varies not only with the particular interpolator-decimator ratio (L/M), but may also vary during the calculation of particular output samples for a given ratio (L/M). For example, it can be shown that where (L/M) is greater than one, i.e., the circuit is an interpolator, either zero or one update input sample is required for the calculation of any output point $y(n)$. In the case of a decimator, however, several input samples may be required to update the system for a particular calculation. Accordingly, the storage capacity of buffer memory 22 is determined by the ratio L/M of a particular embodiment.

Figure 3:
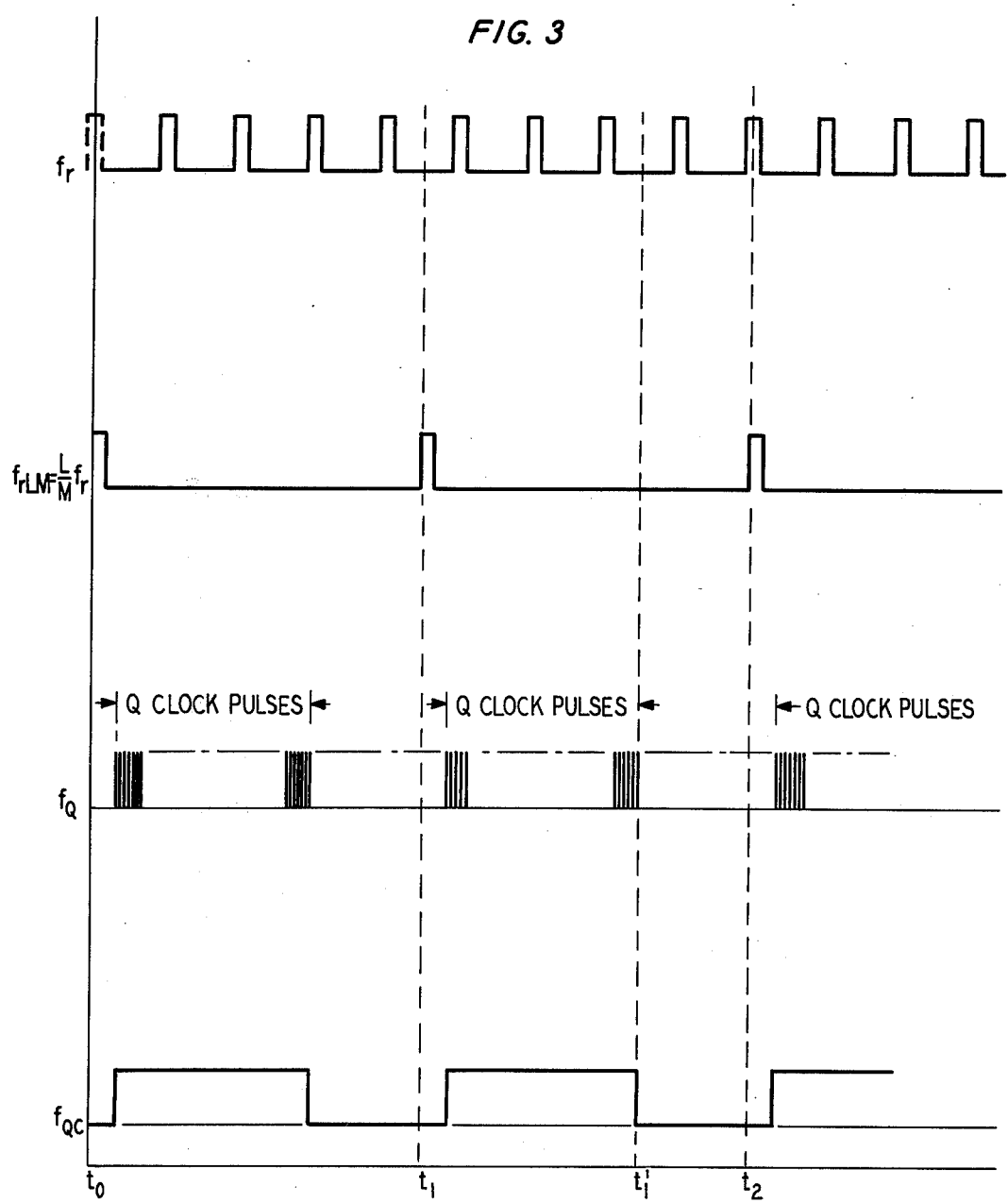
FIG. 3 depicts the timing diagram of the single-stage interpolator-decimator of FIG. 2.

This relationship and the system operating sequence may be further understood by reference to FIG. 3, which illustrates system operation with $L/M = 2/9$. In FIG. 3, $f_r$ is the sampling frequency of the digital system, i.e., an input sample arrives at input terminal 21, with each pulse in the signal $f_r$. As previously stated, the output of countdown logic 35, labeled $f_{rLM}$ in FIG. 3, is derived from the digital system master clock signal, $Lf_r$, by counting down by the factor M. As shown in FIG. 3, the Q-clock signal $f_Q$ is initiated by each output pulse $f_{rLM}$ and Q-counter output $f_{Qc}$ turns Q-clock 37 off after Q-clock pulses have been generated.

It can be noted that FIG. 3 corresponds to the time interval in which two output samples are calculated. During the first subinterval of FIG. 3, denoted $t_0$ to $t_1$, four input samples arrive at input terminal 21 and are stored in buffer memory 22. Thus, at time $t_1$ these four samples will be shifted into shift register 27 to update the system for the calculation of the next output sample. While the system is calculating this output, i.e., during the period of time from $t_1$ until Q-counter 38 reaches the count Q at $t_1'$, three input samples arrive at input terminal 21 and are stored in buffer memory 22. During the period of time between $t_1'$, and $t_2$ (when the next pulse is generated by countdown circuit 35), two more pulses arrive at input terminal 21 and are stored in buffer memory 22. Regardless of whether the input samples arrive during the calculation sequence or in the interval between the end of the calculation sequence and the next pulse from countdown circuit 35, counter 23 counts the arriving input samples. Thus, at time $t_2$ counter 23 has reached the count of five, and the output pulse from countdown circuit 35 (which occurs just after time $t_2$) signals clock 25 and counter 30 to load the five input pulses (in the order of arrival at input terminal 21) into shift register 27. Thus, it may be seen that, regardless of the ratio L/M and the corresponding variation in the number of updating input samples required, e.g., updating by 4 samples at $t_1$ in FIG. 3 and updating by 5 samples at $t_2$, buffer memory 22 always holds the proper number of updating input samples at the beginning of each new calculation sequence.

It will be recognized by those skilled in the art that a multistage interpolator or decimator is often advantageously employed rather than a single stage configuration. This is especially true in applications which require large changes in sampling rate, since multistage structures not only generally result in fewer circuit computations, but also result in less severe filtering constraints, i.e., the filter requirements for each stage of a multistage structure are less stringent than the requirements imposed on the single filter of a single stage structure.

Figure 4:
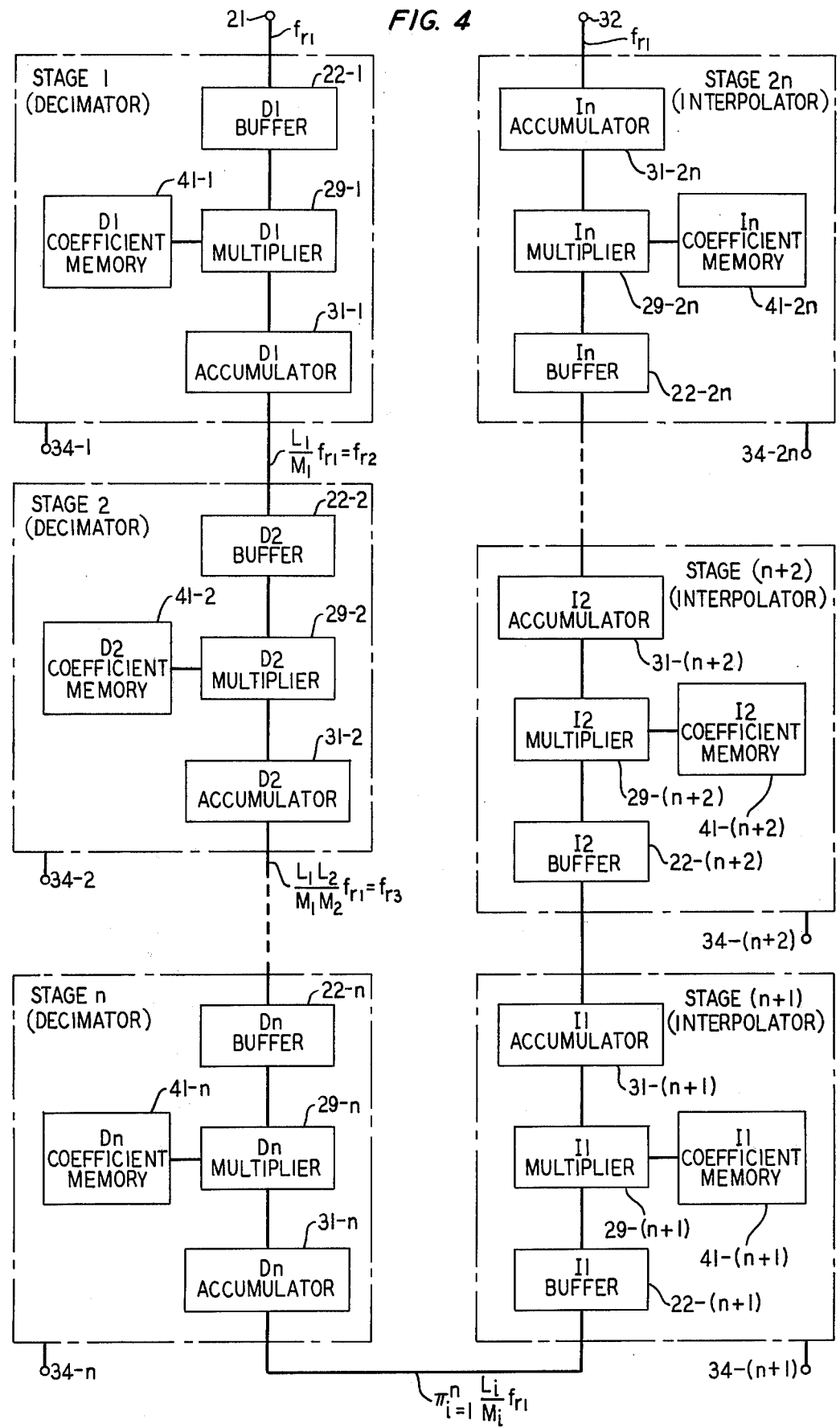
FIG. 4 depicts multistage embodiments of this invention employed as a narrow-band FIR filter.

FIG. 4 depicts an illustrative example of a multistage embodiment of our invention with n-stages in whih (L/M)<1 (n decimators) are cascaded with n stages in which (L/M)>(n interpolators) to realize a narrow-band FIR filter. That is, FIG. 4 is a narrow-band FIR filter which is comprised of 2n circuits such as the circuit embodiment of FIG. 2 with stages $i = 1,2,\ldots,n$ changing the sampling rate by a factor $(L_i/M_i)<1$ and stages $i = n+1, n+2,\ldots,2n$ changing the sampling rate by a factor $(L_i/M_i)>1$. Generally, in such an FIR filter, the sampling rate of the output signal at terminal 32 will be identical to the sampling rate of the input signal at terminal 21. Accordingly, in most instances $$\prod_{i=1}^{n} \frac{L_i}{M_i} = \prod_{i=n+1}^{2n} \frac{M_i}{L_i}.$$

As depicted in FIG. 4, the master clock frequency applied to terminal 34-i of the ith decimation stage 13 $L_i f_{ri}$ where $$f_{ri} = \prod_{i=1}^{n-1} \frac{L_i}{M_i}.$$

The master clock frequency of each decimator stage may, of course, be determined from a single master clock frequency, $L_i f_{ri}$, by counting down from the clock frequency applied to stage $(i - 1)$ by the factor $M_i$. In a like manner, the master clock frequencies of each of the $n$ interpolation stages may be determined from the clock frequency of the preceding interpolator stage by counting up by the appropriate factor $M_i$.

As depicted in FIG. 4, each decimator-interpolator stage includes buffer memory 22-i, multiplier 29-i, accumulator 31-i, and coefficient memory 41-i. Since each of the $n$ stages of decimation and each of the $n$ stages of interpolation also include circuit sequencing means such as depicted in the embodiment of the single-stage interpolator-decimator of FIG. 2, the circuits effectively operate independently of one another. That is, the $(i+1)$th stage simultaneously processes the previous data output of the $i$th stage, while the $i$th stage processes signal samples of the next processing interval. Such a configuration is commonly denoted as a "pipeline" design.

What is claimed is:

1. Apparatus for converting the sampling rate of a digital input signal from $f_r$ to (L/m) $f_r$, where L and M are integers, comprising means for storing Q consecutive samples of said input signal where Q is a predetermined integer;

multiplier means having first and second input terminals for supplying an output signal which is the product of the signals applied to said first and second input terminals;

coefficient storage means for storing L sets of coefficients, $g_i(n)$, $i=0, 1, \ldots, (L-1)$, each of said L sets of coefficients having Q elements with the $k^{th}$ element, $k=0, 1, \ldots, (Q-1)$, equal to $g_i(k) = h(kL + (iM) \text{ modules } L)$, where the function $h$ denotes the coefficients of a direct form FIR filter with unit sample response length N and;

sequences means for sequentially transferring each coefficient set $g_i(n)$ to said first multiplier input terminal and sequentially transferring each of said consecutive Q input samples to said second multiplier input terminal; and accumulation means for summing the products supplied by multiplier means over the range $k=0$ to $k=Q-1$.

2. The sampling rate conversion apparatus of claim 1 wherein Q=N/L.

3. Apparatus for converting an applied digital signal with a sampling rate of $f_r$ to an output signal comprising a series of output samples $y(n)$ at a sampling rate (L/M)$f_r$, where L and M are different integers, comprising:

means for storing a set of Q input signal samples $$x\left(\left(\frac{nM}{L}\right)\right), x\left(\left(\frac{nM}{L}\right)-1\right)\ldots, x\left(\left(\frac{nM}{L}\right)-(Q-1)\right),$$

where Q is a predetermined integer and the expression (nM/L) denotes the next largest integer portion of the quantity included therein;

multiplier means responsive to first and second multiplier input signals for forming the product thereof;

coefficient storage means for storing L sets of coefficients $g_i(n)$, $i=0, 1, \ldots, (L-1)$, each set of coefficients including Q elements with the $k^{th}$ element, $g_i(k)$, $k=0, 1, \ldots, (Q-1)$ equal to $[g_i(k) =] h(kL + (iM)$ module L)

first sequencing means for sequentially and cyclically selecting consecutive coefficient sets;

second sequencing means for simultaneously supplying the $k^{th}$ element of said selected set of coefficients and the $k^{th}$ stored input sample as said first and second multiplier input signals;

means for accumulating the products formed by said multiplier means over the range $k=0$ to $k=(Q-1)$ to form said output signal sample $y(n)$; and means for updating said means for storing said input samples with the input signal samples which occur within a time period of $M/(Lf_r)$ after said input sample $x(nM/L)$.

4. The sampling rate conversion circuit of claim 3 wherein $Q = N/L$, where N is the length of the unit sample response of the digital FIR filter defined by one coefficients $g_i(k)$.

5. The sampling rate conversion apparatus of claim 4 wherein said means for updating said means for storing said input samples includes a memory circuit, means for addressing said memory circuit and counter means for determining the number of input samples which arrive in said time period of $M/(Lf_r)$.

6. The sampling rate conversion apparatus of claim 5 wherein said second sequencing means includes a clock circuit for generating Q clock pulses within the time interval $M/(Lf_r)$, each of said clock pulses supplying said $k^{th}$ input sample and $k^{th}$ coefficient element to said multiplier, said second sequencing means further including means for disabling said clock after the generation of said Q clock pulses and means for restarting said clock at the beginning of the next $M/(Lf_r)$ time interval.

7. Apparatus for converting a sampled data input signal having a sampling rate $f_r$ to a sampled data output signal having a sampling rate $(L/M)f_r$ comprising:

storage means for storing a sequence of Q input signal samples, $$x\left(\frac{nM}{L}\right), x\left(\left(\frac{nM}{L}\right)-1\right), \ldots, x\left(\left(\frac{nM}{L}\right)-(Q-1)\right),$$

where Q is a predetermined integer, the expression (nM/L) denotes the integer portion of the quantity thereby enclosed, and n identifies a particular output sample $y(n)$;

coefficient storage means for storing L sets of coefficients $g_i(k)$, $i=0, 1, \ldots, (L-1)$, each set of coefficients having Q elements, each set of coefficients stored in the sequence $h(kL+(iM)$ modulo L), for $k=0, 1, \ldots (Q-1)$;

a multiplier circuit responsive to a single input sample and a single coefficient for forming the product thereof;

sequencing means for sequentially applying shift signals to said input sample storage means and for sequentially addressing said coefficient storage means to supply said sequence of Q input signal samples and the coefficients of consecutive sets of coefficients of said coefficient storage means to said multiplier circuit;

accumulator means for determining the output sample $y(n)$ by summing the products supplied by said multiplier means over the range $k=0$ to $k=(Q-1)$;

means for updating said input sample storage means by $$\left(\frac{(n+1)M}{L}\right) - \left(\frac{nM}{L}\right)$$

samples; and means connected to said sequencing means for incrementing n by one unit so that said sequencing means, said multiplier means, and said accumulator means sequentially determine each output sample $y(n)$, $y(n+1)$, $y(n+2)$, ...

8. The sample rate conversion apparatus of claim 7 wherein said input sample storage means is a shift register having Q storage locations, said means for updating said input sample storage means includes a memory circuit connected to receive the $$\left(\frac{(n+1)M}{L}\right) - \left(\frac{nM}{L}\right)$$

updating signal samples, a counter circuit to count said updating signal samples, and an address circuit to store each updating signal sample in a separate storage location within said memory circuit during the determination of said output signal $y(n)$, said address circuit further responsive to said counter for sequentially transferring said updating samples to said shift register during said update of said input sample storage means.

9. The sample rate conversion apparatus of claim 8 wherein said sequencing means includes a clock having a frequency of at least $QLF_r/M$, said sequencing means further including means for energizing said clock each time said input sample storage means is updated and means for disabling said clock each time Q clock pulses have been generated, means for applying each of said Q clock pulses as a shift signal to said input sample storage means and addressing said coefficient storage means to supply said $k^{th}$ input sample and said $k^{th}$ coefficient to said multiplier circuit, said sample rate conversion apparatus further including a digital selector circuit responsive to said sequencing means for connecting the input terminal of said shift register to the output terminal of said updating memory circuit during the period of time said clock is disabled, said selector circuit further responsive to said sequencing means for connecting a recirculation path between the input and output terminals of said shift register during the period of time in which said clock generates said Q pulses.

\* \* \* \* \*

UNITED STATES PATENT AND TRADEMARK OFFICE
CERTIFICATE OF CORRECTION

PATENT NO. : 4,020,332
DATED : April 26, 1977
INVENTOR(S) : Ronald E. Crochiere and Lawrence R. Rabiner It is certified that error appears in the above-identified patent and that said Letters Patent are hereby corrected as shown below:

Column 3, lines 5-7, that portion of Equation (1) reading $\sum_{m=}^{N-1}$ should read $\sum_{m=0}^{N-1}$ Column 3, line 39, "Utilizng" should read --Utilizing--; lines 58-60, that portion of Equation (2) reading $\sum_{k=}^{Q-1}$ should read $\sum_{k=0}^{Q-1}$
and "(nM) + " should read --(nM) $\oplus$ --; line 62, "(nM) + L" should read --(nM) $\oplus$ L--, "[(nM/L)]" should read --[nM/L]--; line 63, "(nM/L)" should read --nM/L--; line 64, "1...," should read --1,...,--. Column 4, line 6, should read --must be addressed to arguments, (kL+(nM) $\oplus$ L), where k = 0,1,...Q-1.--; line 9, "Y(0)" should read --y(0)--; line 10, "h(L)..." should read --h(L),...,--; line 12, "coefficient" should read --coefficients--, "+" should read -- $\oplus$ --; line 13, should read --h(L+M $\oplus$ L),...h((Q-1)L+M $\oplus$ L) is required, whereas--; line 15, should read --ents $g_{L-1}(n)$ = h(((L-1)M) $\oplus$ L), h(L+((L-1)M) $\oplus$ L),--; line 16, "..," should read --...,--, "+ L" should read -- $\oplus$ L--; line 61, "(L/M)" should read --L/M--; line 62, "Countdown" should read --countdown--. Column 5, line 50, "(nM) +" should read --(nM) $\oplus$ --; line 53, "(Q-1)" should read --(Q-1))--; line 55, "M + L)" should read --M $\oplus$ L)--. Column 6, line 10, "h(M + L)" should read --h(M $\oplus$ L)--; line 22, "shaft" should read --shift--; line 26, "+ L" should read -- $\oplus$ L--; line 37, "M/Chf$_r$)" should read --M/(Lf$_r$)--; line 55, "(L/M)" should read

UNITED STATES PATENT AND TRADEMARK OFFICE
CERTIFICATE OF CORRECTION

PATENT NO. : 4,020,332

DATED : April 26, 1977

INVENTOR(S) : Ronald E. Crochiere and Lawrence R. Rabiner

It is certified that error appears in the above-identified patent and that said Letters Patent are hereby corrected as shown below:

--L/M--; line 57, should read --L/M. For example, it can be shown that where L/M--. Column 7, line 56, "whih" should read --which--; line 57, "(L/M)" should read --L/M--; line 58, "(L/M)" should read --L/M--; line 63, "($L_1/M_1$)" should read --$L_1/M_1$--; line 65, "($L_1/M_1$)" should read --$L_1/M_1$--. Column 8, line 38, "(L/m)$f_r$" should read --L/M$f_r$--; line 52, "N and;" should read --N;--; line 53, "sequences" should read --sequencer--; line 59, "by multiplier" should read --by said multiplier--; line 66, "(L/M)$f_r$" should read --L/M$f_r$--.

Column 9, line 16, "module" should read --modulo--; line 32, "one" should read --the--; line 53, "(L/M)$f_r$" should read --L/M$f_r$--. Column 10, line 50, "QL$F_r$/M" should read --QL$f_r$/M--.

Signed and Sealed this

*Thirteenth* Day of *December 1977*

[SEAL]

*Attest:*

RUTH C. MASON
*Attesting Officer*

LUTRELLE F. PARKER
*Acting Commissioner of Patents and Trademarks*